(12) United States Patent
Volf et al.

(10) Patent No.: US 8,535,445 B2
(45) Date of Patent: Sep. 17, 2013

(54) ENHANCED WAFER CARRIER

(75) Inventors: Boris Volf, Hillsborough, NJ (US); Yuliy Rashkovsky, Millburn, NJ (US)

(73) Assignee: Veeco Instruments Inc., Plainview, NY (US)

( * ) Notice: Subject to any disclaimer, the term of this patent is extended or adjusted under 35 U.S.C. 154(b) by 515 days.

(21) Appl. No.: 12/855,739

(22) Filed: Aug. 13, 2010

(65) Prior Publication Data

US 2012/0040097 A1    Feb. 16, 2012

(51) Int. Cl.
*C23C 16/00*    (2006.01)
*C23C 16/458*   (2006.01)
*C23C 16/46*    (2006.01)

(52) U.S. Cl.
USPC ............ 118/725; 118/715; 118/728; 118/730

(58) Field of Classification Search
USPC .................................. 118/715, 725, 728, 730
See application file for complete search history.

(56) References Cited

U.S. PATENT DOCUMENTS

| | | | | |
|---|---|---|---|---|
| 5,584,936 | A * | 12/1996 | Pickering et al. | 118/728 |
| 5,645,646 | A * | 7/1997 | Beinglass et al. | 118/730 |
| 5,683,518 | A * | 11/1997 | Moore et al. | 118/730 |
| 5,782,979 | A * | 7/1998 | Kaneno et al. | 118/500 |
| 5,820,686 | A * | 10/1998 | Moore | 118/730 |
| 6,146,464 | A * | 11/2000 | Beinglass et al. | 118/730 |
| 6,444,027 | B1 * | 9/2002 | Yang et al. | 117/200 |
| 6,652,650 | B2 * | 11/2003 | Yang et al. | 117/200 |
| 6,837,940 | B2 * | 1/2005 | Komeno et al. | 118/730 |
| 7,122,844 | B2 * | 10/2006 | Nakamura et al. | 257/89 |
| 7,960,254 | B2 * | 6/2011 | Wada et al. | 438/478 |
| 8,372,204 | B2 * | 2/2013 | Nakamura et al. | 118/725 |
| 2002/0170673 | A1 * | 11/2002 | Tanguay | 156/345.32 |
| 2005/0241580 | A1 * | 11/2005 | Park et al. | 118/715 |
| 2007/0158583 | A1 | 7/2007 | Cho | |
| 2009/0155028 | A1 | 6/2009 | Boguslavskiy et al. | |
| 2009/0308319 | A1 * | 12/2009 | Cheng et al. | 118/728 |
| 2010/0055318 | A1 * | 3/2010 | Volf et al. | 427/255.28 |
| 2010/0055320 | A1 | 3/2010 | Honma | |
| 2011/0049779 | A1 | 3/2011 | Egami et al. | |
| 2011/0114022 | A1 * | 5/2011 | Boguslavskiy et al. | 118/724 |
| 2011/0206843 | A1 * | 8/2011 | Gurary et al. | 427/248.1 |

(Continued)

FOREIGN PATENT DOCUMENTS

EP    0795624 A1    9/1997
EP    1096549 A2    5/2001

(Continued)

OTHER PUBLICATIONS

International Search Report Application No. PCT/US2011/046567, dated Oct. 25, 2011.

*Primary Examiner* — Jeffrie R Lund
(74) *Attorney, Agent, or Firm* — Lerner, David, Littenberg, Krumholz & Mentlik, LLP

(57) ABSTRACT

A wafer carrier used in wafer treatments such as chemical vapor deposition has pockets for holding the wafers and support surfaces for supporting the wafers above the floors of the pockets. The carrier is provided with locks for restraining wafers against upward movement away from the support surfaces. Constraining the wafers against upward movement limits the effect of wafer distortion on the spacing between the wafer and the floor surfaces, and thus limits the effects of wafer distortion on heat transfer. The carrier may include a main portion and minor portions having higher thermal conductivity than the main portion, the minor portions being disposed below the pockets.

6 Claims, 6 Drawing Sheets

(56) References Cited

U.S. PATENT DOCUMENTS

| | | | |
|---|---|---|---|
| 2011/0207299 A1* | 8/2011 | Sakurai | 438/478 |
| 2012/0024231 A1* | 2/2012 | Horino | 118/725 |
| 2012/0040097 A1* | 2/2012 | Volf et al. | 427/255.5 |
| 2012/0073502 A1* | 3/2012 | Volf et al. | 118/725 |
| 2012/0164347 A1* | 6/2012 | Rhee et al. | 427/553 |
| 2012/0171377 A1* | 7/2012 | Volf et al. | 427/255.28 |
| 2013/0065403 A1* | 3/2013 | Paranjpe et al. | 438/758 |

FOREIGN PATENT DOCUMENTS

| | | | |
|---|---|---|---|
| JP | 58128724 A | | 8/1983 |
| JP | 62054929 A | * | 3/1987 |
| JP | 4110466 A | | 4/1992 |
| JP | 10-167885 | | 6/1998 |
| JP | 10-167886 | | 6/1998 |
| JP | 2004-128271 | | 4/2004 |
| WO | 9918599 A2 | | 4/1999 |

\* cited by examiner

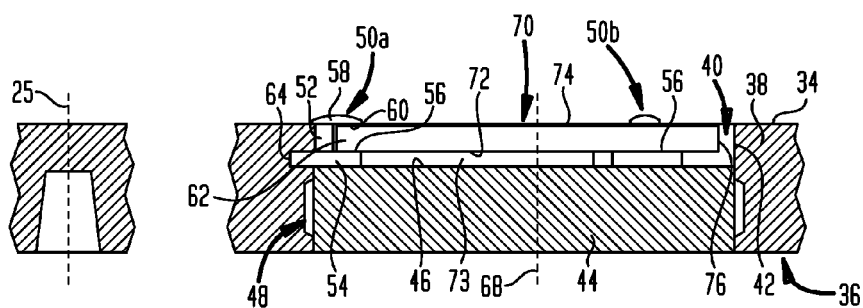
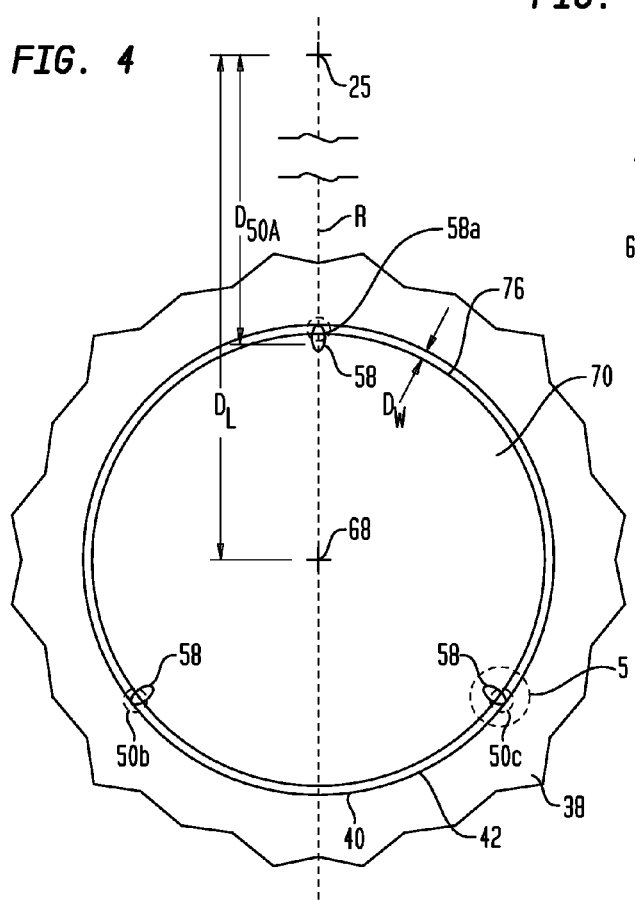
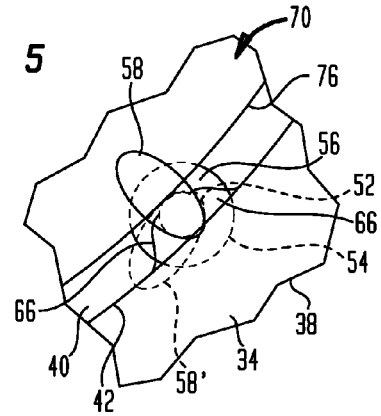

ENHANCED WAFER CARRIER

BACKGROUND OF THE INVENTION

The present invention relates to wafer processing apparatus, to wafer carriers for use in such processing apparatus, and to methods of wafer processing.

Many semiconductor devices are formed by epitaxial growth of a semiconductor material on a substrate. The substrate typically is a crystalline material in the form of a disc, commonly referred to as a "wafer." For example, devices formed from compound semiconductors such as III-V semiconductors typically are formed by growing successive layers of the compound semiconductor using metal organic chemical vapor deposition or "MOCVD." In this process, the wafers are exposed to a combination of gases, typically including a metal organic compound and a source of a group V element which flow over the surface of the wafer while the wafer is maintained at an elevated temperature. One example of a III-V semiconductor is gallium nitride, which can be formed by reaction of an organo-gallium compound and ammonia on a substrate having a suitable crystal lattice spacing, as for example, a sapphire wafer. Typically, the wafer is maintained at a temperature on the order of 500-1100° C. during deposition of gallium nitride and related compounds.

Composite devices can be fabricated by depositing numerous layers in succession on the surface of the wafer under slightly different reaction conditions, as for example, additions of other group III or group V elements to vary the crystal structure and bandgap of the semiconductor. For example, in a gallium nitride based semiconductor, indium, aluminum or both can be used in varying proportion to vary the bandgap of the semiconductor. Also, p-type or n-type dopants can be added to control the conductivity of each layer. After all of the semiconductor layers have been formed and, typically, after appropriate electric contacts have been applied, the wafer is cut into individual devices. Devices such as light-emitting diodes ("LEDs"), lasers, and other electronic and optoelectronic devices can be fabricated in this way.

In a typical chemical vapor deposition process, numerous wafers are held on a device commonly referred to as a wafer carrier so that a top surface of each wafer is exposed at the top surface of the wafer carrier. The wafer carrier is then placed into a reaction chamber and maintained at the desired temperature while the gas mixture flows over the surface of the wafer carrier. It is important to maintain uniform conditions at all points on the top surfaces of the various wafers on the carrier during the process. Minor variations in composition of the reactive gases and in the temperature of the wafer surfaces cause undesired variations in the properties of the resulting semiconductor device. For example, if a gallium and indium nitride layer is deposited, variations in wafer surface temperature will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary. Thus, considerable effort has been devoted in the art heretofore towards maintaining uniform conditions.

One type of CVD apparatus which has been widely accepted in the industry uses a wafer carrier in the form of a large disc with numerous wafer-holding regions, each adapted to hold one wafer. The wafer carrier is supported on a spindle within the reaction chamber so that the top surface of the wafer carrier having the exposed surfaces of the wafers faces upwardly toward a gas distribution element. While the spindle is rotated, the gas is directed downwardly onto the top surface of the wafer carrier and flows across the top surface toward the periphery of the wafer carrier. The used gas is evacuated from the reaction chamber through ports disposed below the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution element typically is maintained at a temperature well below the desired reaction temperature so as to prevent premature reaction of the gases. Therefore, heat is transferred from the resistive heating element to the bottom surface of the wafer carrier and flows upwardly through the wafer carrier to the individual wafers.

Although considerable effort has been devoted in the art heretofore to design an optimization of such systems, still further improvement would be desirable. In particular, it would be desirable to provide better uniformity of temperature across the surface of each wafer, and better temperature uniformity across the entire wafer carrier.

BRIEF SUMMARY OF THE INVENTION

One aspect of the present invention provides methods of processing wafers. A method according to this aspect of the invention desirably includes the steps of rotating a carrier about an axis. The carrier has a plurality of the wafers disposed thereon with top surfaces of the wafers facing in an upward direction parallel to the axis. The method desirably includes supporting the wafers on upwardly-facing support surfaces of the carrier during the rotating step and constraining the wafers against upward movement away from the support surfaces during the rotating step, as well as treating the wafers during the rotating step. The treating step may include transferring heat from the carrier to the wafers. For example, a chemical vapor deposition process as discussed above can be performed during the rotating step. The method desirably further includes the step of constraining the wafers against radial movement away from the axis during the rotating step. In preferred methods according to this aspect of the invention, constraining the wafers against upward movement limits the effects of wafer distortion on heat transfer between the carrier and the wafers, and thus improves uniformity of wafer surface temperature as further discussed below.

A further aspect of the invention provides wafer carriers. A wafer carrier according to this aspect of the invention desirably includes a body having oppositely-facing top and bottom surfaces, the body having a plurality of pockets open to the top surface of the body. The carrier preferably defines an upwardly-facing support surface disposed below the top surface of the body within each pocket. Most preferably, the carrier according to this aspect of the invention includes locks associated with the pockets. Each lock desirably has a downwardly facing lock surface. When the lock is in an operative position, the lock surface extends into or above the associated pocket so that a wafer disposed in the pocket and resting on the support surface will be at least partially constrained against upward movement by the lock surface.

A wafer carrier according to a further aspect of the invention includes a body having oppositely-facing top and bottom surfaces extending in horizontal directions and a plurality of pockets open to the top surface, each such pocket being adapted to hold a wafer with a top surface of the wafer exposed at the top surface of the body. The body desirably includes a main portion formed from a first material having a first thermal conductivity. Preferably, the main portion has vertically-extensive holes aligned with the pockets, and the body further includes minor portions disposed in the holes of the main portion. The minor portions preferably are formed from a second material having a second thermal conductivity higher than the first thermal conductivity. The body may further include a vertically-extensive thermal barrier between the main portion and each minor portion, the thermal barriers inhibiting conduction of heat in horizontal directions between the main portion and the minor portion.

A wafer carrier according to yet another aspect of the invention may include a body having main portions and minor portions, and additionally has a vertically-extensive border portion between the main portion and each minor portion. The border portions desirably have thermal conductivity in the vertical direction different from the thermal conductivity of the main portion.

Yet another aspect of the invention provides treatment apparatus incorporating wafer carriers as discussed above.

BRIEF DESCRIPTION OF THE DRAWINGS

FIG. 3 is a fragmentary, diagrammatic sectional view taken along line 3-3 in FIG. 2, depicting the wafer carrier in conjunction with a wafer.

FIG. 4 is a fragmentary top plan view depicting a portion of the wafer carrier of FIGS. 2 and 3.

FIG. 5 is a fragmentary view on an enlarged scale depicting the region indicated in FIG. 4.

DETAILED DESCRIPTION

Figure 1:
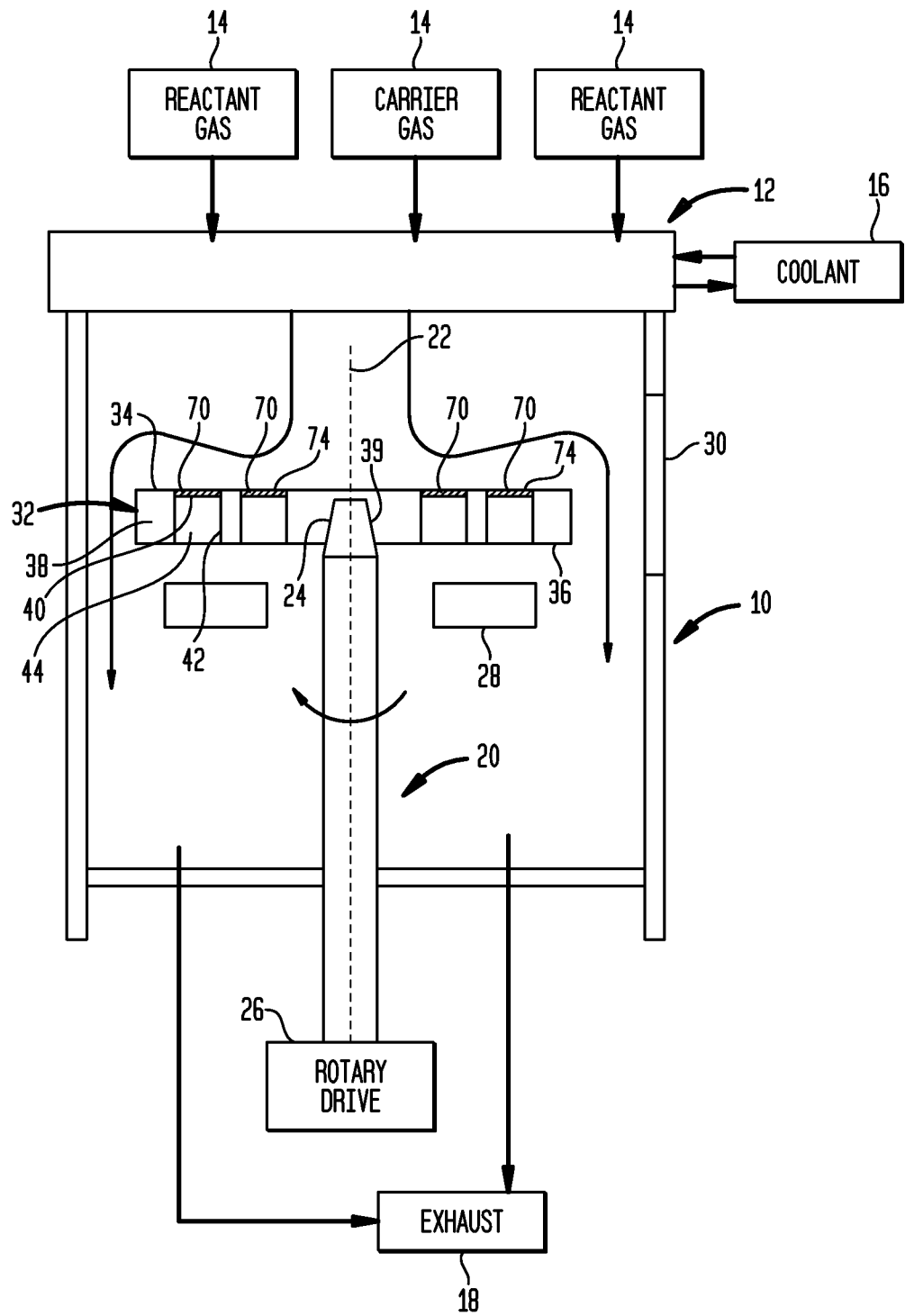
FIG. 1 is a simplified, schematic sectional view depicting chemical vapor deposition apparatus in accordance with one embodiment of the invention.
Figure 2:
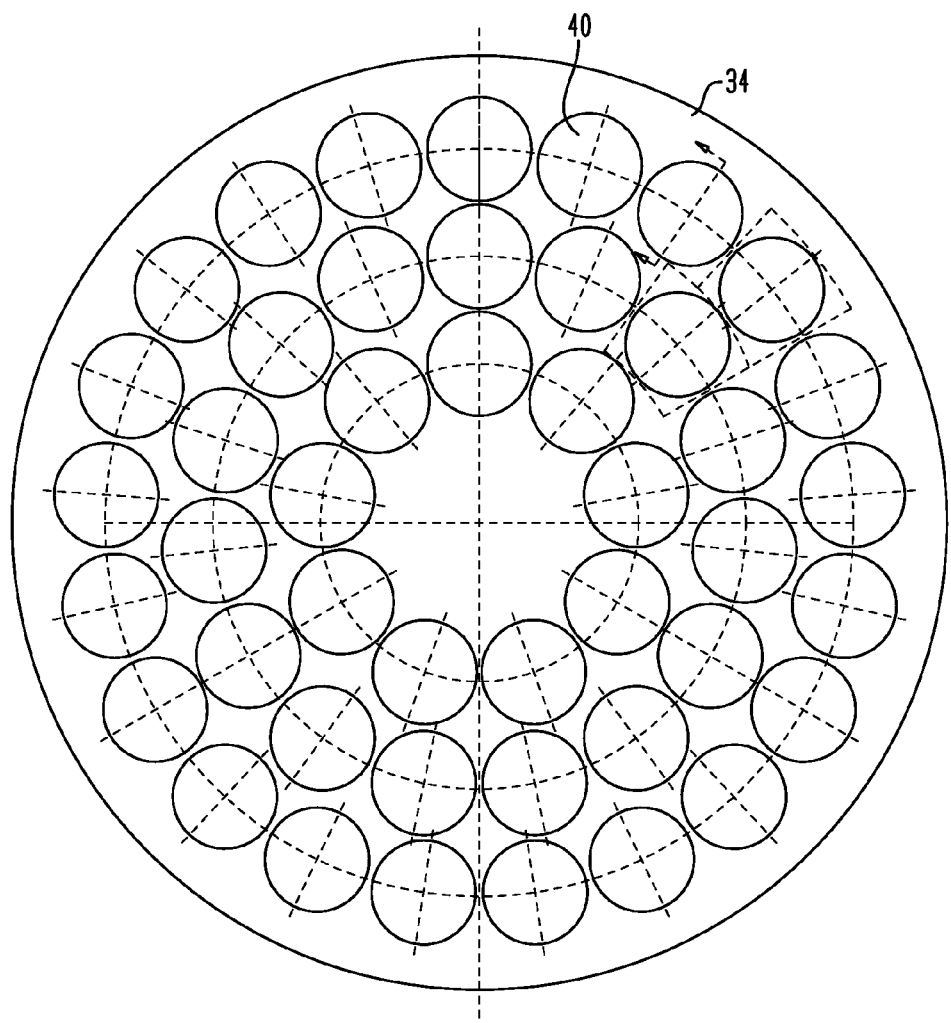
FIG. 2 is a diagrammatic top plan view of a wafer carrier used in the apparatus of FIG. 1.

Chemical vapor deposition apparatus in accordance with one embodiment of the invention includes a reaction chamber 10 having a gas distribution element 12 arranged at one end of the chamber. The end having the gas distribution element 12 is referred to herein as the "top" end of the chamber 10. This end of the chamber typically, but not necessarily, is disposed at the top of the chamber in the normal gravitational frame of reference. Thus, the downward direction as used herein refers to the direction away from the gas distribution element 12; whereas the upward direction refers to the direction within the chamber, toward the gas distribution element 12, regardless of whether these directions are aligned with the gravitational upward and downward directions. Similarly, the "top" and "bottom" surfaces of elements are described herein with reference to the frame of reference of chamber 10 and element 12.

Gas distribution element 12 is connected to sources 14 of gases to be used in the CVD process, such as a carrier gas and reactant gases such as a source of a group III metal, typically a metalorganic compound, and a source of a group V element as, for example, ammonia or other group V hydride. The gas distribution element is arranged to receive the various gases and direct a flow of gasses generally in the downward direction. The gas distribution element 12 desirably is also connected to a coolant system 16 arranged to circulate a liquid through the gas distribution element so as to maintain the temperature of the element at a desired temperature during operation. Chamber 10 is also equipped with an exhaust system 18 arranged to remove spent gases from the interior of the chamber through ports (not shown) at or near the bottom of the chamber so as to permit continuous flow of gas in the downward direction from the gas distribution element.

A spindle 20 is arranged within the chamber so that the central axis 22 of the spindle extends in the upward and downward directions. The spindle has a fitting 24 at its top end, i.e., at the end of the spindle closest to the gas distribution element 12. In the particular embodiment depicted, the fitting 24 is a generally conical element. Spindle 20 is connected to a rotary drive mechanism 26 such as an electric motor drive, which is arranged to rotate the spindle about axis 22. A heating element 28 is mounted within the chamber and surrounds spindle 20 below fitting 24. The chamber is also provided with an openable port 30 for insertion and removal of wafer carriers. The foregoing elements may be of conventional construction. For example, suitable reaction chambers are sold commercially under the registered trademark TURBODISC by Veeco Instruments, Inc. of Plainview, N.Y., USA, assignee of the present application.

In the operative condition depicted in FIG. 1, a wafer carrier 32 is mounted on the fitting 24 of the spindle. The wafer carrier has a structure which includes a body generally in the form of a circular disc having a central axis 25 extending perpendicular to the top and bottom surfaces. The body of the wafer carrier has a first major surface, referred to herein as the "top" surface 34, and a second major surface, referred to herein as the "bottom" surface 36. The structure of the wafer carrier also has a fitting 39 arranged to engage the fitting 24 of the spindle and to hold the body of the wafer carrier on the spindle with the top surface 34 facing upwardly toward the gas distribution element 12, with the bottom surface 36 facing downwardly toward heating element 28 and away from the gas distribution element. Merely by way of example, the wafer carrier body may be about 465 mm in diameter, and the thickness of the carrier between top surface 34 and bottom surface 32 may be on the order of 15.9 mm. In the particular embodiment illustrated, the fitting 39 is formed as a frusto-conical depression in the bottom surface of the body 32. However, as described in copending, commonly assigned US Patent Publication No. 2009-0155028 A1, the disclosure of which is hereby incorporated by reference herein, the structure may include a hub formed separately from the body and the fitting may be incorporated in such a hub. Also, the configuration of the fitting will depend on the configuration of the spindle.

The body desirably includes a main portion 38 formed as a monolithic slab of a non-metallic refractory first material as, for example, a material selected from the group consisting of silicon carbide, boron nitride, boron carbide, aluminum nitride, alumina, sapphire, quartz, graphite, and combinations thereof, with or without a refractory coating as, for example, a carbide, nitride or oxide.

The body of the carrier defines a plurality of circular pockets 40 open to the top surface. As best seen in FIGS. 1 and 3, the main portion 38 of the body defines a substantially planar top surface 34. The main portion 38 has holes 42 extending through the main portion, from the top surface 34 to the bottom surface 36. A minor portion 44 is disposed within each hole 42. The minor portion 44 disposed within each hole defines a floor surface 46 of the pocket 40, the floor surface being recessed below the top surface 34. The minor portions 44 are formed from a second material, preferably a non-metallic refractory material consisting of silicon carbide, boron nitride, boron carbide, aluminum nitride, alumina, sapphire, quartz, graphite, and combinations thereof, with or without a refractory coating as, for example, a carbide, nitride or oxide. The second material desirably is different from the first material constituting the main portion. The second material most preferably has a thermal conductivity higher than the thermal conductivity of the first material. For example, where the main portion is formed from graphite, the minor portions may be formed from silicon carbide. The minor portions 44 and the main portion 38 cooperatively define the bottom surface 36 of the body. In the particular embodiment depicted in FIG. 3, the bottom surface of the main portion 38 is planar, and the bottom surfaces of the minor portions 44 are coplanar with the bottom surface of the main portion, so that the bottom surface 36 is planar.

The minor portions 44 are frictionally engaged with the walls of the holes 40. For example, the minor portions may be press-fit into the holes, or shrink-fitted by raising the main portion to an elevated temperature and inserting cold minor portions into the holes. Desirably, all of the pockets are of uniform depth. This uniformity can be achieved readily by forming all of the minor portions to a uniform thickness as, for example, by grinding or polishing the minor portions.

There is a thermal barrier 48 between each minor portion 44 and the surrounding material of the main portion 38. The thermal barrier is a region having thermal conductivity in the horizontal directions, parallel to the top and bottom surfaces of the carrier, which is lower than the thermal conductivity of the bulk material of the main portion. In the particular embodiment depicted in FIG. 3, the thermal barrier includes a macroscopic gap 48, as, for example, a gap about 100 microns or more thick, formed by a groove in the wall of the main portion 38 defining the hole 42. This gap contains a gas such as air or the process gasses encountered during operation, and hence has much lower thermal conductivity than the neighboring solid materials.

The abutting surfaces of the minor portions 44 and main portion 38 also define parts of the thermal barrier. Although these surfaces abut one another on a macroscopic scale, neither surface is perfectly smooth. Therefore, there will be microscopic, gas-filled gaps between parts of the abutting surfaces. These gaps will also impede thermal conduction between the minor portion 44 and main portion 38.

As best seen in FIGS. 3 and 4, the carrier further includes locks 50 associated with the pockets. The locks 50 preferably are formed from a refractory material having thermal conductivity which is lower than the conductivity of the minor portions 44 and preferably lower than the conductivity of the main portion 38. For example, the locks may be formed from quartz. Each lock includes a middle portion 52 (FIG. 3) in the form of a vertical cylindrical shaft and a bottom portion 54 in the form of a circular disc coaxial with the middle portion and projecting outwardly away from the axis of the middle portion. The bottom portion of each lock defines an upwardly-facing support surface 56. Each lock further includes a top portion 58 projecting transverse to the axis of the middle portion. The top portion is not symmetrical about the axis of the middle portion 52. The top portion 58 of each lock defines a downwardly-facing lock surface 60 overlying the support surface 56 of the lock but spaced apart from the support surface. Thus, each lock defines a gap 62 between surfaces 56 and 60.

Each lock is secured to the wafer carrier. As best seen in FIGS. 3 and 5, the middle portion 52 of each lock lies against the wall of the hole 42 in the main portion. The bottom portion 54 extends into an undercut 64 (FIG. 3) in the wall of the hole, so that the lock is retained against vertical movement relative to the body of the wafer carrier, and so that the bottom portion 50 rests on the floor surface 46 of the pocket. As seen in FIG. 5, the main portion 38 may have projections 66 extending into the pocket from the wall of hole 42 so as to retain the lock against movement in horizontal directions.

With the locks in the operative position shown in FIGS. 3 and 4, the top portion 58 of each lock projects inwardly, toward the center 68 of the pocket. Each lock can be turned to an inoperative position in which the top portion is rotated as depicted in broken lines in FIG. 5 at 58', so that the top portion does not project inwardly toward the center of the pocket.

Three locks 50 are provided for each pocket 50. Lock 50a, referred to herein as an "inner" lock, is disposed at a location lying at a distance $D_{50A}$ (FIG. 4) from the central axis 25 of the carrier body which is less than the distance $D_c$ from the center 68 of the pocket to the central axis 25. Locks 50b and 50c are "outer" locks, which are disposed at distances from the central axis 25 of the carrier greater than the distance $D_c$ from the central axis to the center 68 of the pocket. In the particular arrangement depicted, the locks are spaced apart from one another at around the periphery of the pocket 40, with equal spaces between adjacent locks. The inner lock 50a lies on a radial line R extending through the central axis 25 of the carrier and the center 68 of the pocket, whereas the two outer locks 50b and 50c are disposed on opposite sides of this radial line.

In operation, the carrier is loaded with circular, disc-like wafers 70. With one or more of the locks 50 associated with each pocket in its inoperative position, the wafer is placed into the pocket so that a bottom surface 72 of the wafer rests on the support surfaces 56 of the locks. The support surfaces of the locks cooperatively support the bottom surface 72 of the wafer above the floor surface 46 of the pocket, so that there is a gap 73 (FIG. 3) between the bottom surface of the wafer and the floor surface of the pocket, and so that the top surface 74 of the wafer is coplanar or nearly coplanar with the top surface 34 of the carrier. The dimensions of the carrier, including the locks, are selected so that there is a very small clearance between the edge or peripheral surface 76 of the wafer and the middle portions 52 of the locks. The middle portions of the locks thus center the wafer within the pocket, so that the distance $D_w$ between the edge of the wafer and the wall of the pocket is substantially uniform around the periphery of the wafer.

The locks are brought to the operative positions, so that the top portion 58 of each lock, and the downwardly facing lock surface 60 (FIG. 3) projects inwardly over the pocket and hence over the top surface 74 of the wafer. The lock surfaces 60 are disposed at a vertical level higher than the support surfaces 56. Thus, the wafer is engaged between the support surfaces 56 and the lock surfaces, and constrained against upward or downward movement relative to the carrier. The top and bottom elements of the locks desirably are as small as practicable, so that these elements contact only very small parts of the wafer surfaces adjacent the periphery of each wafer. For example, the lock surfaces and support surfaces may engage only a few square millimeters of the wafer surfaces.

Typically, the wafers are loaded onto the carrier while the carrier is outside of the reaction chamber. The carrier, with the wafers thereon, is loaded into the reaction chamber using conventional robotic apparatus (not shown), so that the fitting 39 of the carrier is engaged with the fitting 24 of the spindle, and the central axis 25 of the carrier is coincident with the axis 22 of the spindle. The spindle and carrier are rotated about this common axis. Depending on the particular process employed, such rotation may be at hundreds of revolutions per minute or more.

The gas sources 14 are actuated to supply process gasses and carrier gasses to the gas distribution element 12, so that these gasses flow downwardly toward the wafer carrier and wafers, and flow generally radially outwardly over the top surface 34 of the carrier and over the exposed top surfaces 74 of the wafers. The gas distribution element 12 and the walls of chamber 10 are maintained at relatively low temperatures to inhibit reaction of the gasses at these surfaces.

Heater 28 is actuated to heat the carrier and the wafers to the desired process temperature, which may be on the order of 500 to 1200° C. for certain chemical vapor deposition processes. Heat is transferred from the heater to the bottom surface 36 of the carrier body principally by radiant heat transfer. The heat flows upwardly by conduction through the main portion 38 of the carrier body to the top surface 34 of the body. Heat also flows upwardly through the minor portions 44 of the wafer carrier, across the gaps 73 between the floor surfaces of the pockets and the bottom surfaces of the wafers, and through the wafers to the top surfaces 74 of the wafers. Heat is transferred from the top surfaces of the body and wafers to the walls of chamber 10 and to the gas distribution element 12 by radiation, and is also transferred to the process gasses.

The process gasses react at the top surfaces of the wafers to treat the wafers. For example, in a chemical vapor deposition processes, the process gasses form a deposit on the wafer top surfaces. Typically, the wafers are formed from a crystalline material, and the deposition process is epitaxial deposition of a crystalline material having lattice spacing similar to that of the material of the wafer.

For process uniformity, the temperature of the top surface of each wafer should be constant over the entire top surface of the wafer, and equal to the temperature of the other wafers on the carrier. To accomplish this, the temperature of the top surface of 74 of each wafer should be equal to the temperature of the carrier top surface 34. The temperature of the carrier top surface depends on the rate of heat transfer through the main portion 38 of the body, whereas the temperature of the wafer top surface depends on the rate of heat transfer through the minor portion 44, the gap 73 and the wafer itself. The high thermal conductivity, and resulting low thermal resistance, of the minor portions 44 compensates for the high thermal resistance of the gaps 73, so that the wafer top surfaces are maintained at temperatures substantially equal to the temperature of the carrier top surface. This minimizes heat transfer between the edges of the wafers and the surrounding portions of the carrier and thus helps to maintain a uniform temperature over the entire top surface of each wafer. To provide this effect, the floor surfaces of the pockets 46 must be at a higher temperature than the adjacent parts of the main portion 38. The thermal barriers 48 between the minor portions 44 and the main portion 38 of the body minimize heat loss from the minor portions 44 to the main portion, and thus help to maintain this temperature differential.

During operation, each wafer tends to move away from the central axis 25 of the carrier due to the centrifugal forces caused by rotation of the carrier. Each wafer is maintained precisely centered in the pocket by the middle portions 52 of the locks. The centrifugal forces urge each wafer against the middle portions 52 of the outer locks 50b and 50c. These portions act as abutment elements, which restrain the wafer against outward movement. The precise centering of the wafer maintains the uniform distance $D_w$ between the edge of the wafer and the surrounding wall of the pocket, and avoids direct contact between the wafer and the pocket wall. This minimizes heat transfer between the wafer and the carrier, and also helps to assure that any heat transfer which does occur is substantially radially symmetrical about the center of the wafer.

Figure 6:
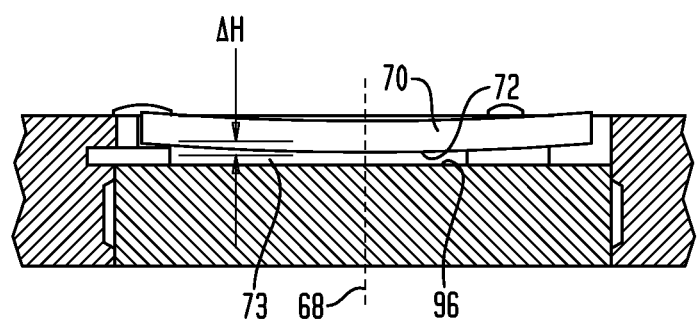
FIG. 6 is a view similar to FIG. 3 but depicting the wafer carriers and wafer of FIGS. 1-5 during a different operating condition.

During operation, the wafer may distort from a flat disc to a domed shape. For example, epitaxial deposition of a crystalline material having an undistorted lattice spacing slightly different from the undistorted lattice spacing of the crystalline material of the wafer applies a tensile or compressive stress at the top surface of the wafer, and the wafer distorts to relieve such stress. FIG. 6 depicts the same wafer and pocket as shown in FIG. 3, with the wafer 70 distorted to a dome-like shape. Such distortion causes the center of the wafer to bow towards or away from the floor surface 46 of the pocket, and thus causes the height of the gap 73 between the wafer bottom surface 72 and floor surface 46 to vary. With the edges of the wafer restrained against upward movement by the locks 50, the difference in height ΔH of the gap is relatively small; it is given by the formula:

$$\Delta H = K * d^2 / 8$$

Where:
K is the wafer curvature; and
d is the diameter of the wafer.

Figure 7:
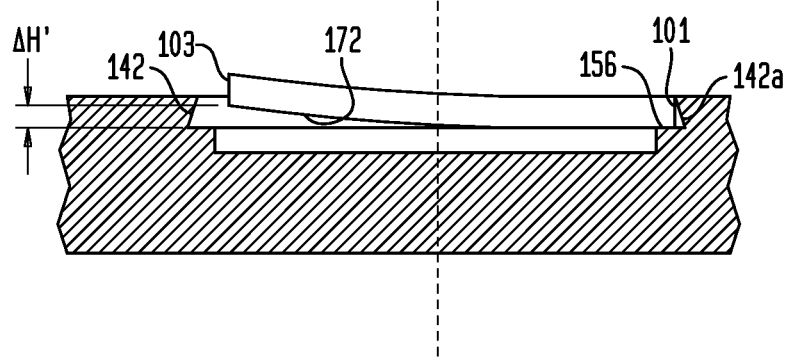
FIG. 7 is a view similar to FIG. 7 but depicting a conventional wafer carrier and wafer in an operating condition similar to that of FIG. 7.

In a conventional wafer carrier shown in FIG. 7, the pocket has an undercut peripheral wall 142, and a circular support surface 156. The wafer comes to rest against an outer portion 142a of the peripheral wall furthest from the central axis of the carrier. The undercut peripheral wall holds the outer part 101 of the wafer down against the support surface 156. However, the inner part 103 of the wafer, closest to the central axis of the carrier, is not restrained against upward movement relative to the carrier, so that the curvature of the wafer causes the inner part 103 to lift upwardly, away from the support surface 156. This causes a large difference in the height ΔH' of the gap 173 between the bottom surface 172 of the wafer and the floor surface 146 of the pocket. Using the conventional wafer carrier:

$$\Delta H' = K * d^2 / 2.$$

Stated another way, the difference ΔH with the edge of the wafer restrained by the locks (FIG. 3) is only one-fourth the difference ΔH' with the conventional carrier. Because the rate of heat transfer across the gap varies directly with the height of the gap, the dramatic reduction in the difference in gap height provides a corresponding reduction in differences in heat transfer to various parts of the wafer. Moreover, with the wafer restrained by the locks (FIG. 3) the height of the gap, and hence the heat transfer, vary in a pattern which is radially symmetrical about the center of the wafer. Because the inner part of the wafer edge does not lift up when the wafer is restrained, there will be no disturbance in the flow of gasses across the wafer carrier and wafer top surfaces caused by edges of the wafer projecting above the top surface of the carrier.

The locks themselves may cause small, localized disturbances in the gas flow. This phenomenon is minimized by making the locks, and particularly the top portions 58 of the locks, as small as possible and as thin as possible. Also, the top portions of the locks preferably have streamlined shapes. There will be some minor heat transfer by conduction through the locks, but this effect is limited by the small areas of contact between the locks and the wafer, and by the low thermal conductivity of the locks.

Figure 8:
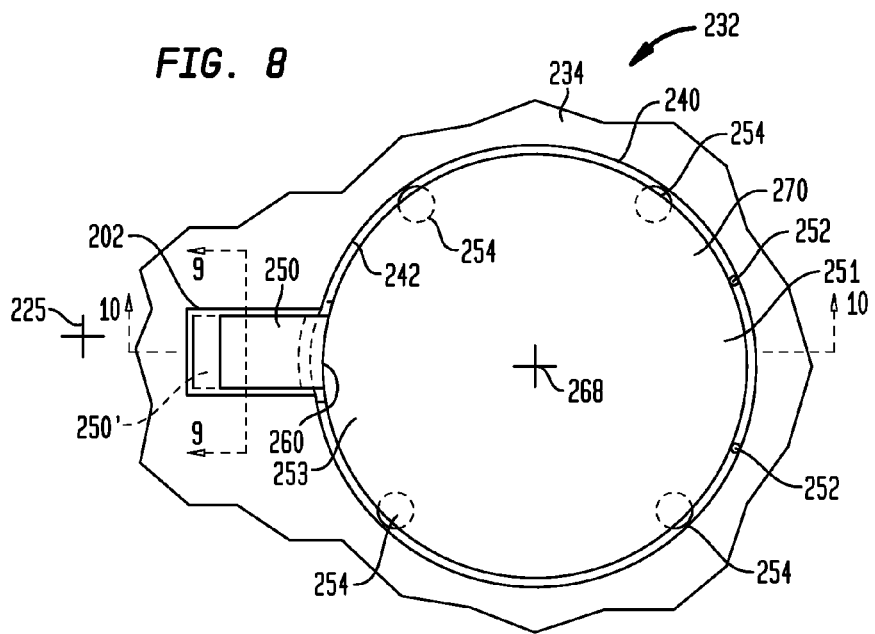
FIG. 8 is a fragmentary top plan view depicting a wafer carrier according to a further embodiment of the invention.
Figure 9:
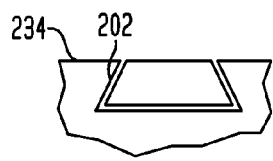
FIG. 9 is a fragmentary sectional view on an enlarged scale taken along line 9-9 in FIG. 8.
Figure 10:
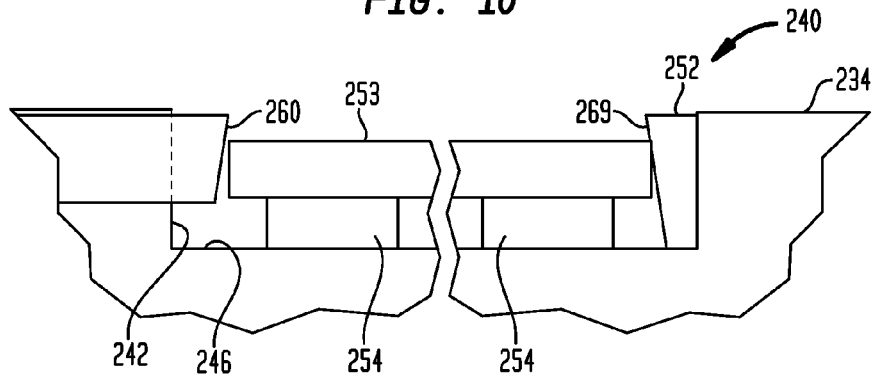
FIG. 10 is a fragmentary sectional view on an enlarged scale taken along line 10-10 in FIG. 8.

The configuration discussed above can be varied. For example, locks as discussed above can be used with a wafer carrier having a unitary body without the minor portions discussed above. Also, the configuration of the locks, support surfaces and abutment elements can be varied from that discussed above. The wafer carrier depicted in FIGS. 8-10 has a unitary body 232 defining pockets 240. An upwardly-facing support surface within each pocket is defined by a plurality of small support elements 254 in the form of disc-like buttons resting on the floor surface 246 of the pocket. These support elements are distributed around the periphery of the pocket.

Each pocket also has a lock 250. The lock is slidably mounted to the carrier body for movement in directions towards and away from the central axis 225 of the carrier. The lock has a wafer-engaging surface 260 (FIGS. 8 and 10) which slopes away from the center 268 of the pocket in the downward direction. Stated another way, the lower portion of surface 268 lies further from the center 268 of the pocket and closer to the central axis 225 of the carrier than the upper portion of the same surface. Thus, surface 260 faces downwardly toward the floor surface 246 as well as inwardly toward the center of the pocket. The carrier has a channel 202 which, as seen in cross-section in FIG. 9, has a dovetail or generally trapezoidal shape. Lock 250 has a corresponding shape. The lock is engaged in the channel so that the lock can move between the inoperative position shown in broken lines at 250' and the operative position shown in solid lines. In the operative position, the end of the lock with engaging surface 260 projects into the pocket and beyond the vertical wall 242 of the pocket so that surface 268 bears on the upper edge of a wafer 270 received in the pocket. The centrifugal force caused by rotation of the carrier urges the lock away from the central axis 225 and thus toward the center 268 of the pocket. Thus, as the carrier rotates, lock 250 holds the inner part 253 of the wafer down and forces the wafer into engagement with the supports 254. The dimensions of the lock are exaggerated for clarity of illustration. In practice, those parts of the lock which contact the wafer should be as small as practicable to minimize heat transfer through the lock.

Each pocket also has abutment elements 252. The abutment elements are disposed at distances further from the central axis 225 of the carrier than the center 268 of the pocket. The abutment elements have surfaces 269 sloping away from the central axis 225 in the downward direction. In operation, centrifugal forces on the wafer tend to force the wafer against surfaces 269, so that the abutment elements hold the outer part 251 of the wafer down against supports 254. The abutment elements may be formed separately from the carrier body or may be integral with the carrier body.

Figure 11:
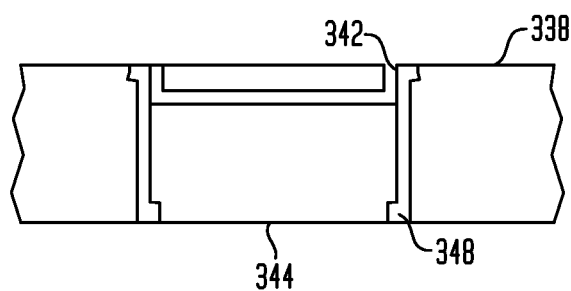
FIGS. 11, 12, and 13 are fragmentary, diagrammatic sectional views depicting portion of wafer carriers in accordance with further embodiments of the invention.

In a further variant (FIG. 11), minor portions 344 of the carrier body may be mounted to the main portion 338 by bushings 348 formed from quartz or another material having thermal conductivity lower than the conductivities of the main portion and minor portions. Here again, the minor portion desirably has higher thermal conductivity than the main portion. The bushing serves as part of the thermal barrier between the minor portion and main portion. The solid-to-solid interfaces between the bushing and minor portion, and between the bushing and main portion, provide additional thermal barriers. In this variant, the bushing defines the vertical wall 342 of the pocket.

Figure 12:
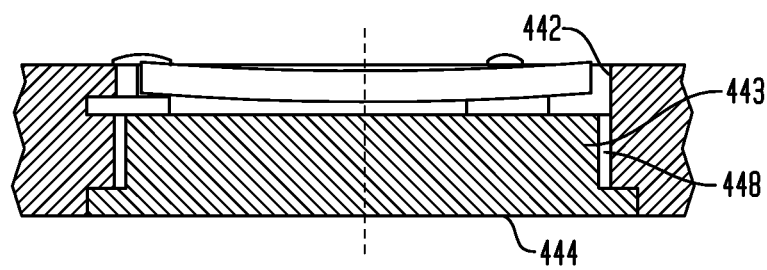

The embodiment of FIG. 12 is similar to the embodiment discussed above with reference to FIGS. 1-6, except that each minor portion 444 includes a body 443 of smaller diameter than the corresponding hole 442 in the main portion 438, so that a gap 448 is provided as a thermal barrier. Each minor portion also includes a head 445 closely fitted in the main portion 438 to maintain concentricity of the minor portion and the hole 442.

Figure 13:
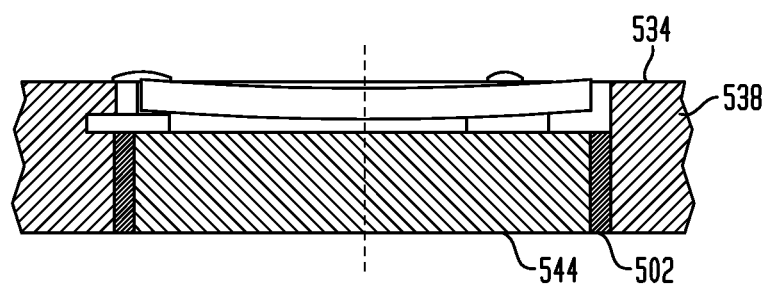

The wafer carrier of FIG. 13 includes a main portion and minor portions 544 similar to the carrier discussed above with reference to FIGS. 1-6. However, the carrier body of FIG. 13 includes ring-like border portions 502 encircling the minor portions and disposed between each minor portion and the main portion. The border portions 502 have thermal conductivity different from the thermal conductivity of the main portion and minor portions. As illustrated, the border portions are aligned beneath the periphery of each pocket. In a further variant, the border portions may be aligned beneath a part of the top surface 534 surrounding each pocket. The thermal conductivity of the border portions can be selected independently to counteract heat transfer to or from the edges of the wafers. For example, where those portions of the top surface 534 tend to be hotter than the wafer, the thermal conductivity of the border portions can be lower than the conductivity of the main portion.

The wafer carriers and apparatus discussed above can materially reduce temperature differences across the surfaces of the wafers. However, even with the features discussed above, some temperature non-uniformity can occur. Because the temperature distribution is generally radially symmetrical about the center of each wafer, other measures which tend to suppress temperature differences can be applied readily. For example, as disclosed in co-pending, commonly assigned US Patent Application Publication No. 2010-0055318, the disclosure of which is hereby incorporated by reference herein, the thermal conductance of the wafer carrier can be varied by varying its thickness. For example, where the wafer tends to bow toward the floor surface of the pocket at the center of the pocket as shown in FIG. 6, the thermal conductance of the gap at the center of the pocket will be higher than the thermal conductance of the gap near the edge of the pocket. This can be counteracted by increasing the thickness of the carrier body in the region of the body beneath the center of the pocket, so as to reduce the thermal conductance in this area.

As these and other variations and combinations of the features described above can be utilized, the foregoing description of the preferred embodiments should be taken as illustrating, rather than limiting, the scope of the invention.

The invention claimed is:

1. A wafer carrier comprising a body having oppositely-facing top and bottom surfaces extending in horizontal directions and a plurality of pockets open to the top surface, each such pocket being adapted to hold a wafer with a top surface of the wafer exposed at the top surface of the body, the body including a main portion formed from a first material having a first thermal conductivity, the main portion having vertically-extensive holes aligned with the pockets, the body further including minor portions formed from a second material having a second thermal conductivity higher than the first thermal conductivity, the minor portions being disposed in the holes of the main portion, the body having a vertically-extensive thermal barriers between the main portion and each minor portion, the thermal barriers inhibiting conduction of heat in horizontal directions between the main portion and the minor portion.

2. A wafer carrier as claimed in claim 1 wherein the minor portions define floor surfaces of the pockets recessed below the top surface, the minor portions also defining parts of the bottom surface.

3. A wafer carrier as claimed in claim 1 wherein the thermal barriers include interfaces between abutting surfaces of the minor portions and the main portions.

4. A wafer carrier comprising a body having oppositely-facing top and bottom surfaces extending in horizontal directions and a plurality of pockets open to the top surface, each such pocket being adapted to hold a wafer with a top surface of the wafer exposed at the top surface of the body, the body including a main portion having vertically-extensive holes aligned with the pockets, the body further including minor portions disposed in the holes of the main portion, the body having a vertically-extensive border portion between the main portion and each minor portion, the border portions having thermal conductivity in the vertical direction different from the thermal conductivity of the main portion.

5. A wafer carrier as claimed in claim 4 wherein the minor portions have thermal conductivity different from the main portion and different from the border portions.

6. A wafer carrier as claimed in claim 4 wherein the pockets are circular.

\* \* \* \* \*